(12) United States Patent
Fu et al.

(10) Patent No.: US 11,963,318 B2
(45) Date of Patent: Apr. 16, 2024

(54) SUPPORTING PLATE AND FOLDABLE DISPLAY DEVICE

(71) Applicant: Wuhan China Star Optoelectronics Semiconductor Display Technology Co., Ltd., Hubei (CN)

(72) Inventors: Yafei Fu, Hubei (CN); Yapeng Cheng, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 435 days.

(21) Appl. No.: 17/297,547

(22) PCT Filed: Apr. 28, 2021

(86) PCT No.: PCT/CN2021/090530
§ 371 (c)(1),
(2) Date: May 27, 2021

(87) PCT Pub. No.: WO2022/205552
PCT Pub. Date: Oct. 6, 2022

(65) Prior Publication Data
US 2023/0354533 A1 Nov. 2, 2023

(30) Foreign Application Priority Data
Mar. 27, 2021 (CN) .......................... 202110329033.0

(51) Int. Cl.
*H05K 5/02* (2006.01)
(52) U.S. Cl.
CPC .................................. *H05K 5/0217* (2013.01)
(58) Field of Classification Search
CPC .................................................. H05K 5/0217
See application file for complete search history.

(56) References Cited

U.S. PATENT DOCUMENTS

| | | | | |
|---|---|---|---|---|
| 10,342,121 B2* | 7/2019 | Koo | ..................... | H05K 5/0017 |
| 11,703,632 B2* | 7/2023 | Wen | ..................... | G02B 6/0081 |
| | | | | 361/679.02 |

(Continued)

FOREIGN PATENT DOCUMENTS

| | | |
|---|---|---|
| CN | 106252378 | 12/2016 |
| CN | 110211497 | 9/2019 |

(Continued)

OTHER PUBLICATIONS

Conclusion on the Patentability of the Invention dated Feb. 13, 2023 From the Eurasian Patent Organization, Eurasian Patent Office Re. Application No. 202193070/31 and Its Translation Into English. (5 Pages).

(Continued)

*Primary Examiner* — Anthony Q Edwards
*Assistant Examiner* — Hung Q Dang

(57) ABSTRACT

A supporting plate and a foldable display device are provided. The supporting plate includes at least one bending region and non-bending regions. The bending region includes two semi-bending regions bent symmetrically along a bending axis. Any of the semi-bending regions includes an internally bending region and an externally bending region. The internally bending region is located on an end away from the non-bending regions. The externally bending region is located on an end close to the non-bending regions and has a bending direction opposite to the internally bending region. The semi-bending regions include a plurality of openings spaced apart. A distribution density of the openings in the internally bending region is greater than a distribution density of the openings in the externally bending region.

19 Claims, 11 Drawing Sheets

(56) References Cited

U.S. PATENT DOCUMENTS

| | | |
|---|---|---|
| 2016/0357052 A1 | 12/2016 | Kim et al. |
| 2019/0132947 A1 | 5/2019 | Koo et al. |
| 2019/0132987 A1* | 5/2019 | Koo .................. H05K 7/18 |
| 2019/0196548 A1 | 6/2019 | Kim et al. |
| 2020/0051881 A1 | 2/2020 | Park et al. |
| 2021/0165454 A1* | 6/2021 | Dong .................. G06F 1/1652 |
| 2022/0343809 A1* | 10/2022 | Chen .................. G06F 1/1601 |
| 2023/0111654 A1* | 4/2023 | Li .................. G09F 9/301 |
| | | 361/807 |

FOREIGN PATENT DOCUMENTS

| | | |
|---|---|---|
| CN | 110649087 | 1/2020 |
| CN | 110853525 | 2/2020 |
| CN | 110992828 | 4/2020 |
| CN | 111312080 | 6/2020 |
| CN | 111316344 | 6/2020 |
| CN | 111477107 | 7/2020 |
| CN | 111653204 | 9/2020 |
| CN | 111724678 | 9/2020 |
| CN | 211604573 | 9/2020 |
| CN | 211928943 | 11/2020 |
| CN | 112164318 | 1/2021 |
| CN | 112489564 | 3/2021 |
| CN | 112509466 | 3/2021 |
| KR | 10-2016-0144912 | 12/2016 |
| KR | 10-2019-0080740 | 7/2019 |
| WO | WO 2020/228893 | 11/2020 |

OTHER PUBLICATIONS

International Search Report and the Written Opinion dated Nov. 5, 2021 From the International Searching Authority re. Application No. PCT/CN2021/090530 and Its Translation Into English. (15 Pages).
Notice of Reasons for Refusal dated Jun. 12, 2023 From the Japan Patent Office Re. Applciation No. 2021-550048 and Its Translation Into English. (13 Pages).
Notification of Office Action and Search Report dated Oct. 9, 2021 From The State Intellectual Property Office of the People's Republic of China Re. Application No. 202110329033.0 and Its Translation Into English. (22 Pages).
Opinion Submission Notice dated Apr. 26, 2023 From the Korean Intellectual Property Office Re. Application No. 10-2021-7022823 and Its Translation Into English. (7 Pages).
Request for the Submission of An Opinion dated Oct. 28, 2022 From the Korean Intellectual Property Office Re. Application No. 10-2021-7022823 and Its Translation Into English. (15 Pages).

\* cited by examiner

SUPPORTING PLATE AND FOLDABLE DISPLAY DEVICE

RELATED APPLICATIONS

This application is a National Phase of PCT Patent Application No. PCT/CN2021/090530 having International filing date of Apr. 28, 2021, which claims the benefit of priority of Chinese Patent Application No. 202110329033.0 filed on Mar. 27, 2021. The contents of the above applications are all incorporated by reference as if fully set forth herein in their entirety.

FIELD AND BACKGROUND OF THE INVENTION

The present invention relates to the field of display technology and particularly to a supporting plate and a foldable display device.

Description of Prior Art

Foldable mobile phones are an important direction of research and development of current mobile phones. Currently, foldable mobile phones appearing on the market mainly have two ways: inward-folding and outward-folding. The inward-folding way is favored by many consumers because screens are on the inside when they are bent, and are not easily damaged. According to final bending forms of the screens, the inward-folding is divided into wedge-shaped bending and water drop-shaped bending. Because mobile phones of the wedge-shaped bending form cannot be completely closed, there are gaps in a middle. In contrast, mobile phones of the water drop-shaped bending form do not have this defect. After they are folded, they are allowed to be completely closed. Therefore, the mobile phones of the water drop-shaped bending form are further favored by consumers. However, because bending forms of screens of mobile phones of the water drop-shaped bending form are similar to water drop, inward bending regions and outward bending regions are present. However, at a border between the internally bending regions and the externally bending regions, adhesive peeling easily appears. In contrast, this situation seldom occurs on the wedge-shaped and outward-folding mobile phones. The problem of adhesive layers peeling during screen bending processes is one of the most serious problems in the water drop-shaped bending screens, which severely limits development of water drop-shaped folding mobile phones.

Currently, a hole-digging design is adopted on a material of supporting plates at bottoms of foldable screens in bending regions to realize a purpose of supporting the screens while being easily folded. However, designs of the holes at bending regions of the supporting plates are relatively simple. Although adopting a uniform hole size in the bending regions can realize the purpose of easy bending, bending shapes cannot be controlled. Therefore, the problem of adhesive layers peeling at the bending regions of the screens cannot be solved.

SUMMARY OF THE INVENTION

Embodiments of the present invention provide a supporting plate and a foldable display device to solve a technical problem that inability of controlling bending shapes causes peeling of adhesive layers easily to occur at border between internally bending regions and the externally bending regions in the water drop-shaped foldable screens due to adopting the design of the uniform hole size current of the current supporting plate, thereby affecting reliability of the foldable screens.

One embodiment of the present invention provides a supporting plate used to support a flexible display panel. The supporting plate has at least one bending region and non-bending regions located on two sides of the bending region. The bending region includes two semi-bending regions bent symmetrically along a bending axis. Any of the semi-bending regions includes an internally bending region located on an end away from the non-bending regions and an externally bending region located on an end close to the non-bending regions and having a bending direction opposite to the internally bending region. The semi-bending regions include a plurality of openings spaced apart. A distribution density of the openings in the internally bending region is a first distribution density, and a distribution density of the openings in the externally bending region is a second distribution density. Wherein, the first distribution density is greater than the second distribution density.

In at least one embodiment of the present invention, in a direction from the semi-bending regions toward the non-bending regions, the first distribution density of the internally bending region is gradually decreased, and the second distribution density of the externally bending region is gradually decreased.

In at least one embodiment of the present invention, the semi-bending regions further include a transition region disposed between the internally bending region and the externally bending region, a distribution density of the openings in the transition region is a third distribution density, and the third distribution density is less than the second distribution density.

In at least one embodiment of the present invention, the plurality of openings are distributed in a plurality of rows, and the plurality of openings in two adjacent rows are arranged in a staggered manner.

In at least one embodiment of the present invention, intervals between two adjacent openings in one same row are first intervals, lengths of the openings in a row direction are first lengths, and the openings satisfy at least one of following conditions:
  the first lengths of the internally bending region are greater than the first lengths of the transition region and are greater than the first lengths of the externally bending region, and the first lengths of the transition region are less than the first lengths of the externally bending region; or
  the first intervals of the internally bending region are less than the first intervals of the transition region and are less than the first intervals of the externally bending region, and the first intervals of the transition region are greater than the first intervals of the externally bending region.

In at least one embodiment of the present invention, intervals between the plurality of openings in the two adjacent rows are second intervals, and wherein the second intervals between each row of the semi-bending regions are same.

In at least one embodiment of the present invention, widths of overlapping regions between openings in two adjacent rows are first overlapping widths, and in a direction from the semi-bending regions toward the non-bending regions, the first overlapping widths are gradually decreased from a positive number to a negative number.

In at least one embodiment of the present invention, intervals between the plurality of openings in two adjacent rows are second intervals, and in a direction from the semi-bending regions toward the non-bending regions, the second intervals are gradually increased.

In at least one embodiment of the present invention, a sum of the first lengths and the first intervals are second lengths, and wherein the second lengths of each row of the semi-bending regions are same.

In at least one embodiment of the present invention, the internally bending region includes a plurality of sub-internally bending regions, in the direction from the semi-bending regions toward the non-bending regions, the first lengths of the plurality of sub-internally bending regions are gradually decreased.

In at least one embodiment of the present invention, in the direction from the semi-bending regions toward the non-bending regions, the second intervals of the plurality of sub-internally bending regions are same.

In at least one embodiment of the present invention, the second intervals of the transition region are equal to the second intervals of the externally bending region.

In at least one embodiment of the present invention, the externally bending region includes a first sub-externally bending region away from the non-bending regions and a second sub-externally bending region close to the non-bending regions, and the openings on the externally bending region are all located in the first sub-externally bending region.

In at least one embodiment of the present invention, the first lengths of the openings of the semi-bending regions are gradually decreased from the internally bending region to the transition region and are gradually increased from the transition region to the first sub-externally bending region, a bending radius of curvature of the semi-bending regions is gradually increased from the internally bending region to the transition region and is gradually decreased from the transition region to the first sub-externally bending region.

In at least one embodiment of the present invention, in the direction from the semi-bending regions toward the non-bending regions, the first lengths of the plurality of sub-internally bending regions of the internally bending region are gradually decreased, and the bending radius of curvature of the plurality of sub-internally bending region is gradually decreased.

In at least one embodiment of the present invention, a bending radius of curvature of the first sub-externally bending region is less than a bending radius of curvature of the second sub-externally bending region, and the bending radius of curvature of the second sub-externally bending region is greater than the bending radius of curvature of the transition region.

In at least one embodiment of the present invention, lengths of the openings in a row direction are first lengths, in the plurality of openings arranged in one same column, the first lengths of the internally bending region are greater than the first lengths of the transition region and are greater than the first lengths of the externally bending region, and the first lengths of the transition region are less than the first lengths of the externally bending region.

In at least one embodiment of the present invention, the bending region includes a central line, the central line is perpendicular to the bending axis, and the bending region is symmetrical about the central line.

In at least one embodiment of the present invention, the openings are strip-shaped openings extending along a direction of the bending axis.

In at least one embodiment of the present invention, the bending region includes a plurality of fractures spaced apart, and the fractures are formed by borders between the openings and edges of the bending region perpendicular to the bending axis.

One embodiment of the present invention further provides a foldable display device, including the supporting plate of any aforesaid embodiment and a flexible display panel disposed on a side of the supporting plate.

Wherein the flexible display panel includes at least one bending part and non-bending parts located on two sides of the bending part, wherein the bending part corresponds to the bending region of the supporting plate, the bending part includes two semi-bending parts symmetrically bent along the same bending axis as the supporting plate, any of the semi-bending parts includes an internally bending portion corresponding to the internally bending region of the supporting plate and an externally bending portion corresponding to the externally bending region of the supporting plate.

In at least one embodiment of the present invention, the foldable display device further includes a backplate disposed on a side of the flexible display panel close to the supporting plate; and a polarizer sheet disposed on a side of the flexible display panel away from the supporting plate.

By designing the distribution density of the openings in the internally bending region to be greater than the distribution density of the openings in the externally bending region in the supporting plate, risk of adhesive layers peeling at border between the internally bending region and externally bending region is allowed to be reduced when the foldable display device is bent.

DESCRIPTION OF REFERENCE NUMBERS OF ACCOMPANYING FIGURES

| reference numbers in accompanying figures | name of element | reference numbers in accompanying figures | name of element |
| --- | --- | --- | --- |
| 10 | supporting plate | 11 | non-bending region |
| 12 | bending region | 13 | bending axis |
| 121 | semi-bending region | 1211 | internally bending region |
| 1212 | externally bending region | 1213 | transition region |
| 101 | first sub-internally bending region | 102 | second sub-internally bending region |
| 103 | third sub-internally bending region | 104 | fourth sub-internally bending region |
| 105 | fifth sub-internally bending region | 106 | first sub-externally bending region |
| 107 | second sub-externally bending region | L1 | first length |
| L2 | second length | S | first interval |
| D | second interval | a | semi-major axis |
| b | semi-minor axis | 100 | foldable display device |
| 20 | backplate | 30 | flexible display panel |
| 40 | polarizer sheet | L1' | third length |
| 14 | opening | 15 | fracture |

DESCRIPTION OF SPECIFIC EMBODIMENTS OF THE INVENTION

The present application provides a supporting plate and a foldable display device. For making the purposes, technical solutions, and effects of the present invention clearer and more definite, the present invention will be further described in detail below. It should be understood that the specific embodiments described herein are merely for explaining the present invention and are not intended to limit the present invention.

The present invention targets a technical problem of reliability of foldable screens being affected by the adoption of a design of uniform hole size by current supporting plates at a bending region, which cannot control a bending shape and causes adhesive layers to easily peel at a border between internally bending regions and externally bending regions in water drop-shaped foldable screens. Embodiments are provided to overcome the defect.

Figure 1:
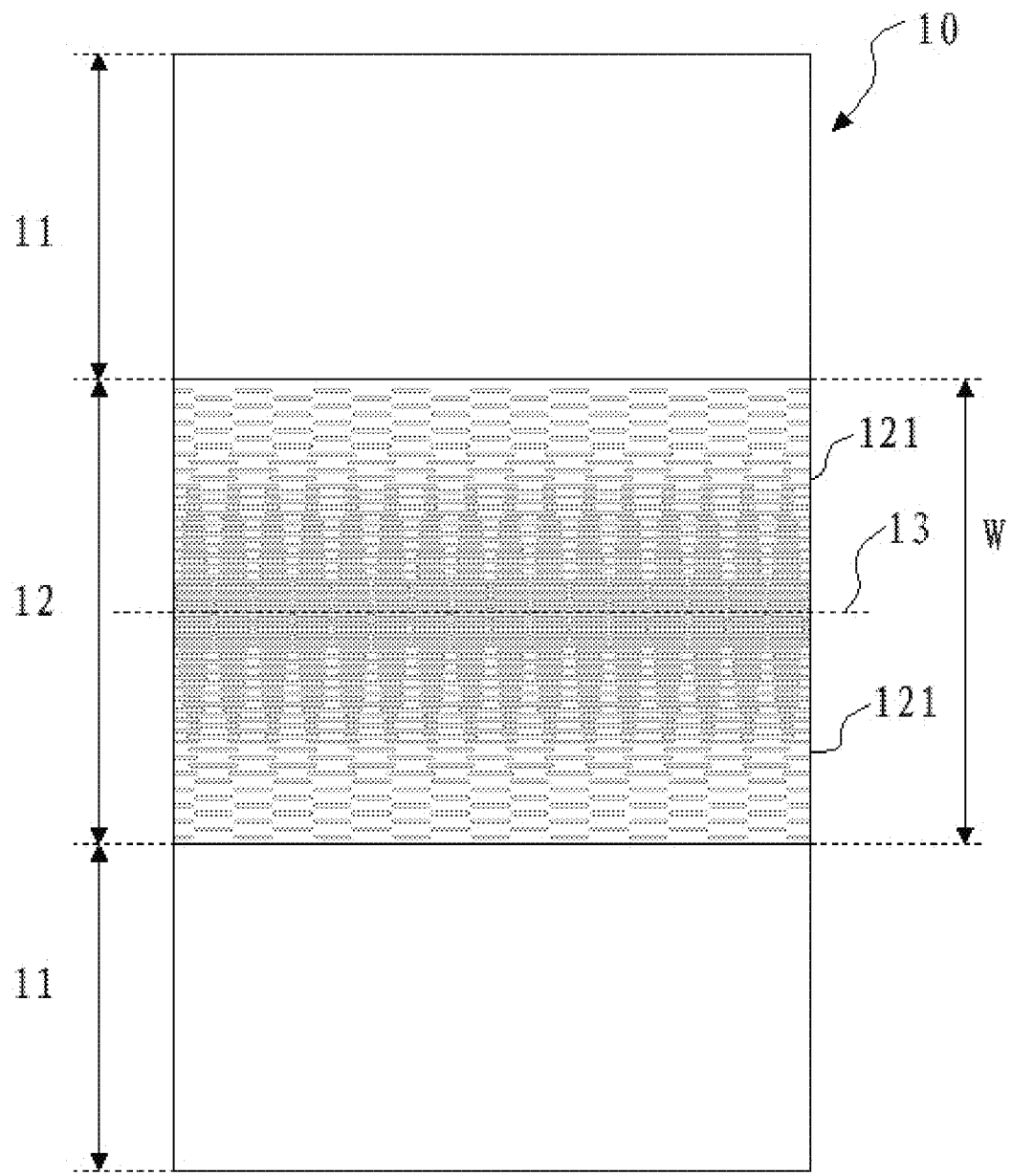
FIG. 1 is a planar schematic diagram of a supporting plate provided by one embodiment of the present invention.

Please refer to FIG. 1, one embodiment of the present invention provides a supporting plate 10 used to support a flexible display panel. The supporting plate 10 has at least one bending region 12 and non-bending regions 11 located on two sides of the bending region 12. The bending region 12 includes two semi-bending regions 121 bent symmetrically along a bending axis 13.

Figure 2:
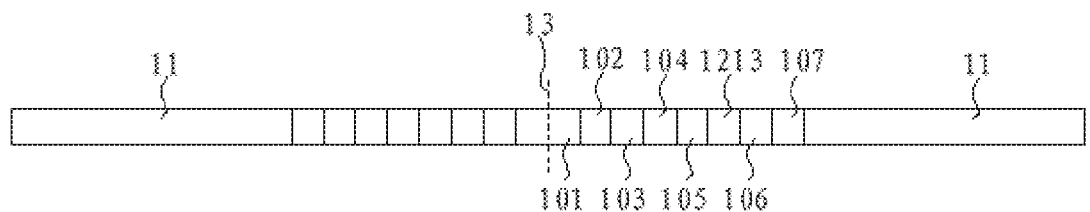
FIG. 2 is a sectional schematic diagram of the supporting plate provided by one embodiment of the present invention.
Figure 3:
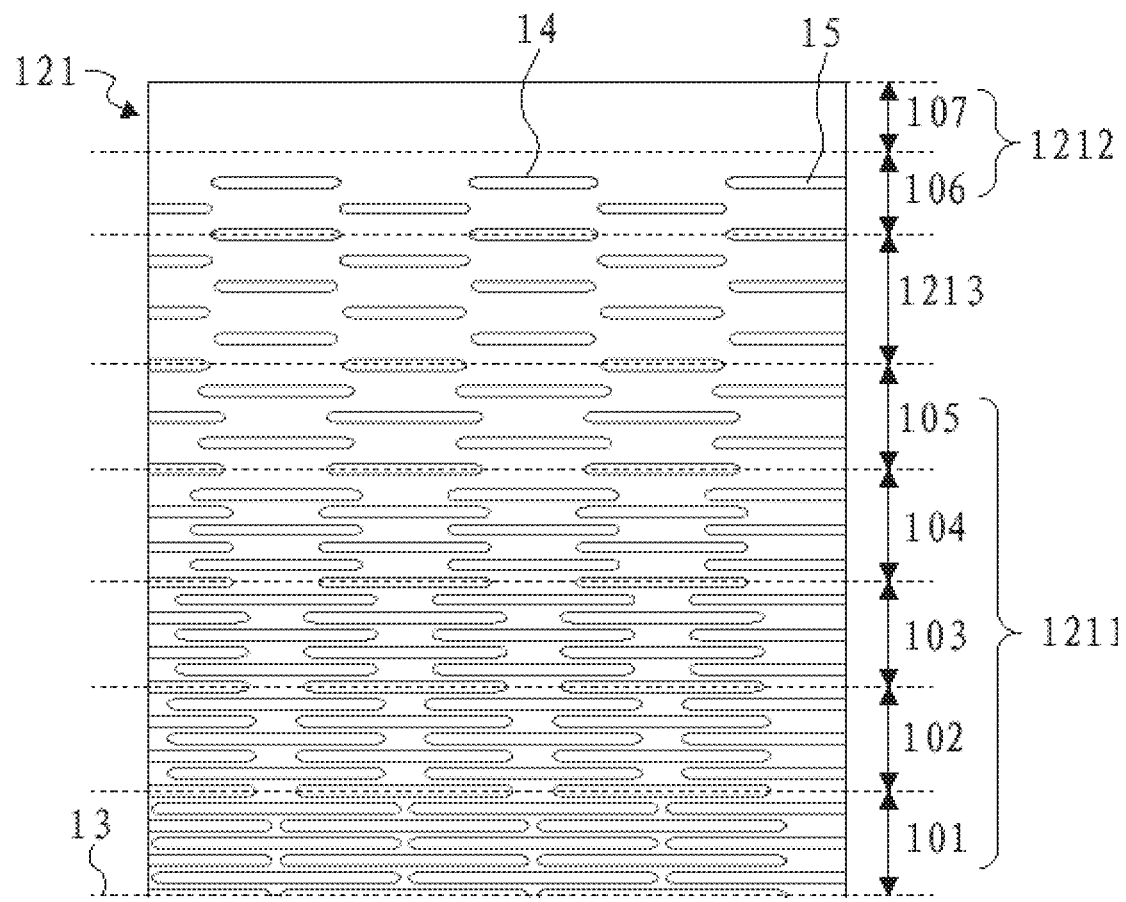
FIG. 3 is a planar schematic diagram of semi-bending regions of the supporting plate provided by one embodiment of the present invention.
Figure 4:
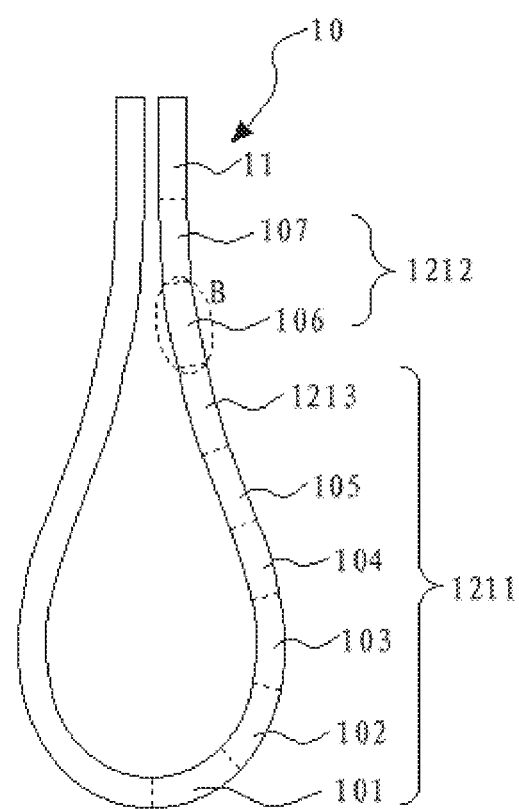
FIG. 4 is a structural schematic diagram after the supporting plate provided by one embodiment of the present invention is bent.

Wherein, please refer to FIG. 2 to FIG. 4, any of the semi-bending regions 121 includes an internally bending region 1211 and an externally bending region 1212. The internally bending region 1211 is located on an end away from the non-bending regions 11. The externally bending region 1212 is located on an end close to the non-bending regions, and a bending direction of the internally bending region 1211 is opposite to a bending direction of the externally bending region 1212.

The semi-bending regions 121 include a plurality of openings 14 spaced apart. A distribution density of the openings in the internally bending region 1211 is a first distribution density, and a distribution density of the openings in the externally bending region 1212 is a second distribution density. Wherein, the first distribution density is greater than the second distribution density. The distribution density of the openings mentioned in the embodiments of the present invention refers to a ratio that a sum of an area of the openings in a unit-region area of the support plate 10 occupies in the unit-region area. For example, the distribution density of the openings of the internally bending region 1211 is a ratio of a sum of areas of the openings in the internally bending region 1211 to an area of the internally bending region 1211, and the distribution density of the openings of the externally bending region 1212 is a ratio of a sum of areas of the openings in the externally bending region 1212 to an area of the externally bending region 1212.

By designing the first distribution density of the internally bending region 1211 to be greater than the second distribution density of the externally bending region 1212 in the supporting plate 10, compared to a design that a distribution density of openings of an internally bending region is equal to a distribution density of openings of an externally bending region, embodiments of the present invention is more conducive to reducing risk of adhesive layers peeling at border between the internally bending region and externally bending region when the foldable display device is bent.

Specifically, in a direction from the semi-bending regions 121 to the non-bending regions 11, the first distribution density of internally bending region 1211 is gradually decreased, and the second distribution density of the externally bending region 1212 is gradually decreased. By adopting the design that the distribution density of the openings in the internally bending region 1211 is gradually decreased and the distribution density of the openings in the externally bending region 1212 is gradually decreased, on a first aspect, the risk of adhesive layers peeling during bending processes is allowed to be reduced, and on the other hand, compared to a single-patterned opening design, a bending radius of the foldable screen in different bending regions is allowed to be adjusted, a bending radius of the entire screen can be optimized, and a design space of an overall machine can be increased.

The plurality of openings 14 in one embodiment of the present invention are distributed in a plurality of rows. The plurality of openings 14 in two adjacent rows are arranged in a staggered manner, which is conducive to dispersing stress when the screen is bent.

Furthermore, the openings 14 can be strip-shaped openings extending along a direction of the bending axis 13. In other embodiments, the openings 14 can be other shapes, such as a rhombus, an ellipse, a circle, etc., which are not limited herein.

Specifically, the distribution density of the openings in each bending region can be changed by changing lengths in the internally bending region 1211 and the externally bending region 1212, intervals between openings in a row direction, or intervals between openings in a column direction.

In one embodiment, the semi-bending regions 121 further include a transition region 1213 disposed between the internally bending region 1211 and the externally bending region 1212, a distribution density of the openings in the transition region 1213 is a third distribution density, and the third distribution density is less than the second distribution density. Further disposing the aforesaid transition region 1213 is conducive to the water drop-shaped bending supporting plate 10 to adapt transition from inward bending to outward bending, and the risk of adhesive layers peeling is further reduced.

Figure 5:
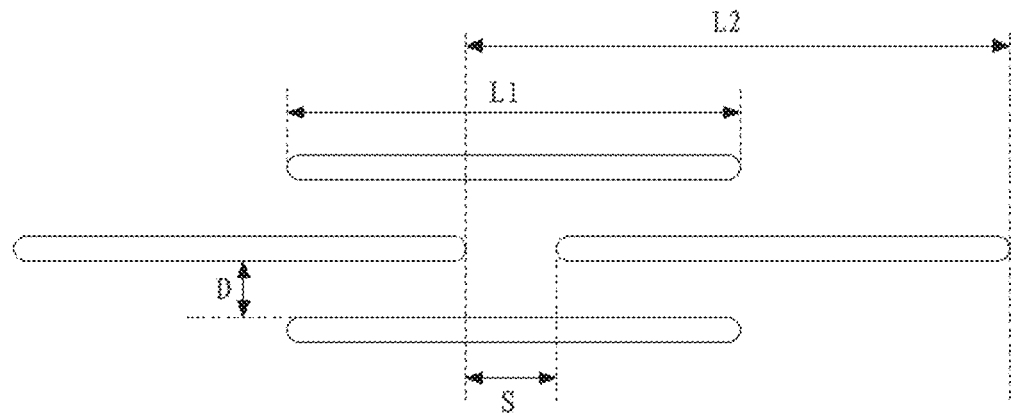
FIG. 5 is a structural schematic diagram of openings in two adjacent rows of the supporting plate provided by one embodiment of the present invention.

Please refer to FIG. 5. Intervals between two adjacent openings 14 in one same row are first intervals. Lengths of the openings 14 in a row direction are first lengths L1. Intervals between the plurality of openings in two adjacent rows are second intervals D.

Wherein, the distribution density of the openings in different bending regions can be changed by changing dimensions of the first intervals S of the different bending regions or/and dimensions of the first lengths L1 of the different bending regions, thereby allowing the first distribution density of the internally bending region 1211 > the second distribution density of the externally bending region 1212 > the third distribution density of the transition region 1213. By reducing the distribution density of the openings of the transition region 1213 at the border between the internally bending region 1211 and the externally bending region 1212, strength of a material of the supporting plate 1213 is increased, which is conducive to remedying stress concentration phenomenon at the border.

Specifically, the openings 14 satisfy at least one of following conditions: the first lengths L1 of the internally bending region 1211 are greater than the first lengths L1 of the transition region 1213 and are greater than the first lengths L1 of the externally bending region 1212, and the first lengths L1 of the transition region 1213 are less than the first lengths L1 of the externally bending region 1212; or the first intervals S of the internally bending region 1211 are less than the first intervals S of the transition region 1213 and are less than the first intervals S of the externally bending region 1212, and the first intervals S of the transition region 1213 are greater than the first intervals S of the externally bending region 1212.

Please refer to FIG. 3, in some embodiments of the present invention, regarding the plurality of openings 14 arranged in one same column, the first lengths L1 of the internally bending region 1211 are greater than the first lengths L1 of the transition region 1213 and are greater than the first lengths L1 of the externally bending region 1212, and the first lengths L1 of the transition region 1213 are less than the first lengths L1 of the externally bending region 1212.

Please refer to FIG. 5. A sum of the first lengths L1 and the first intervals S are second lengths L2, i.e., L2=L1+S. In one embodiment, the second lengths L2 of each row of the semi-bending regions 121 are same. That is, by maintaining the second lengths L2 of each bending region to be unchanged and by changing the first lengths L1 and the first intervals S of each bending region at the same time, the distribution density of the openings of each bending region is changed.

Figure 9:
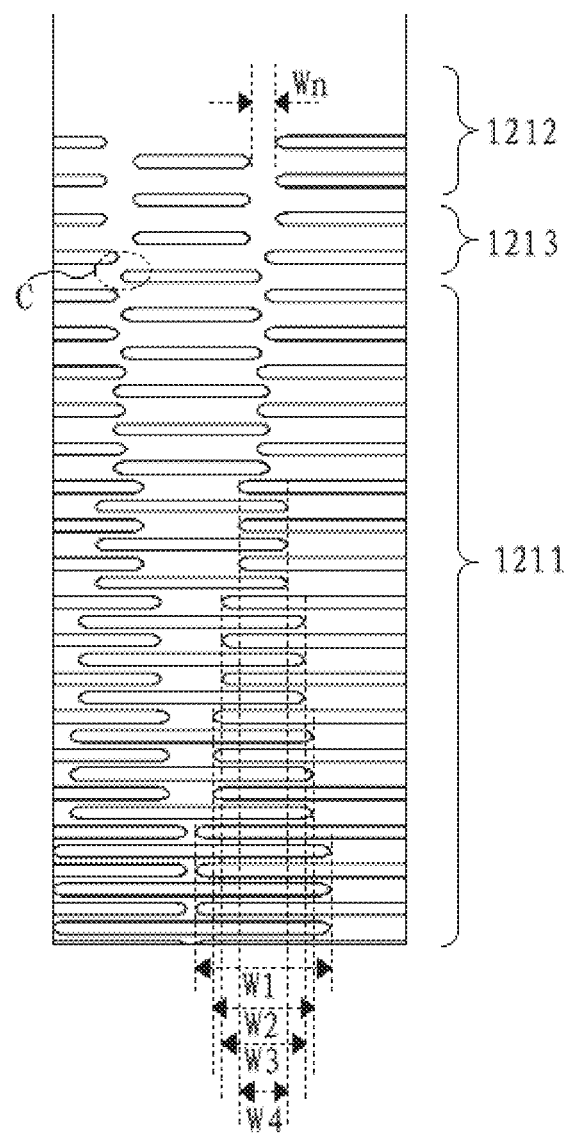
FIG. 9 is a structural schematic diagram of a supporting plate provided by a first embodiment of the present invention.

In one embodiment of the present invention, please refer to FIG. 9. Widths of overlapping regions between openings 14 in two adjacent rows are first overlapping widths, and in a direction from the semi-bending regions 121 toward the non-bending regions, the first overlapping widths are gradually decreased from a positive number to a negative number, i.e., the overlapping regions between the openings in the two adjacent rows are gradually reduced, until there are no overlapping regions between the openings in the two adjacent rows, and then a gap between the openings in the two rows becomes increasingly larger. Wherein, when the first overlapping widths are greater than zero, it represents that there are overlapping regions; and when the first overlapping widths are less than zero, it represents that there is no overlapping region.

As illustrated in FIG. 9, for example, in the direction from the semi-bending region 121 toward the non-bending regions 11, the first overlapping widths W1, W2, W3, W4 . . . , Wn are gradually decreased. Wherein, Wn is less than zero, which represents an absence of an overlapping region between corresponding openings at this place, and W1 to W4 are greater than zero, which represents a presence of overlapping regions between corresponding openings at this place.

In one embodiment, please refer to FIG. 9. The second intervals D of each row of the semi-bending regions 121 can be same. In another embodiment, please refer to FIG. 10. In the direction from the semi-bending regions 121 toward the non-bending regions 11, the second intervals are gradually increased. Compared to the design of unchanged second intervals D, not only the risk of peeling of the adhesive layers at the place of maximum cohesive force can be reduced, but also the stress of the supporting plate 10 after being bent is allowed to be reduced.

Specifically, the internally bending region 1211 includes a plurality of sub-internally bending regions. The second intervals D of the plurality of sub-internally bending regions can be same. The second intervals D of the transition region 1213 are equal to the second intervals D of the externally bending region 1212 and are greater than the second intervals D of the sub-internally bending regions. Because the openings of the internally bending region 1211 are relatively more than the overlapping region of the transition region and the externally bending region, and distances between top portions of the adjacent openings are farther, stress is more easily dispersed during bending. Therefore, only increasing the second intervals D of the transition region 1213 and the externally bending region 1212 is allowed.

In the direction from the semi-bending regions 121 toward the non-bending regions 11, the first lengths L1 of the plurality of sub-internally bending regions are gradually decreased.

In the direction from the semi-bending regions 121 toward the non-bending regions 11, the first intervals S of the plurality of sub-internally bending regions are gradually increased. Please refer to FIG. 2 and FIG. 3. One embodiment of the present invention takes five internally bending regions as an example for description. In the direction from the semi-bending regions 121 toward the non-bending regions 11, the internally bending region 1211 sequentially includes a first sub-internally bending region 101, a second sub-internally bending region 102, a third sub-internally bending region 103, a fourth sub-internally bending region 104, and a fifth sub-internally bending region 105.

In this embodiment, please refer to FIG. 3. In the plurality of openings in any sub-internally bending region, the first lengths L1 are same, the first intervals S are same, and the second intervals D are same.

In one embodiment, the externally bending region 1212 includes a first sub-externally bending region 106 away from the non-bending regions 11 and a second sub-externally bending region 107 close to the non-bending regions 11, and the openings 14 of the externally bending region 1212 are all located in the first sub-externally bending region 106.

By reserving a pattern of the material of the supporting plate in the second sub-externally bending region 107, stiffness and strength of regions of the bending region 12 close to the non-bending regions 11 are enhanced, which prevents stiffness and strength from changing drastically at the border between the bending region 12 and the non-bending region 11, and can also prevent the supporting plate 10 from being fractured due to stress concentration.

In one embodiment, the openings 14 are strip-shaped openings. Four corners of the strip-shaped openings can be designed as chamfers to prevent stress concentration.

Figure 6:
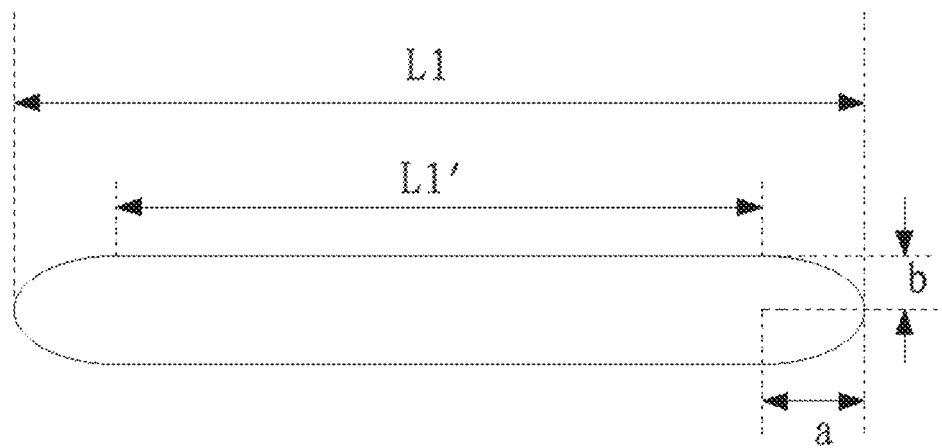
FIG. 6 is a structural schematic diagram of the openings provided by one embodiment of the present invention.

Furthermore, please refer to FIG. 6. Two opposite sides of an extending direction of the openings 14 are semi-elliptical. A direction of a semi-major axis a of a side of the semi-ellipse is same as the extending direction of the openings, and a direction of a semi-minor axis b is perpendicular to the extending direction of the openings. A third length of connection between focal points of the two semi-ellipses of the opening is L1', and the first length of the opening L1=L1'+2a.

Specifically, a width W of the bending region 12 in one embodiment of the present invention ranges from 20 mm to 40 mm, and the second lengths L2 of each row of the bending region 12 can be maintained as same. A value range of the second lengths can range from 4 mm to 6 mm.

Dimensional design of each region of the bending region 12 is shown in Table 1:

TABLE 1

| region | second length L2/mm | third length L1'/mm | semi-major axis a/mm | semi-minor axis b/mm | first interval S/mm | second interval D/mm |
|---|---|---|---|---|---|---|
| first sub-internally bending region 101 | 4-6 | 3.53-5.30 | 0.17-0.25 | 0.07-0.14 | 0.13-0.20 | 0.08-0.16 |
| second sub-internally bending region 102 | 4-6 | 3.04-4.56 | 0.17-0.25 | 0.07-0.14 | 0.63-0.94 | 0.08-0.16 |
| third sub-internally bending region 103 | 4-6 | 2.64-3.96 | 0.17-0.25 | 0.07-0.14 | 0.84-1.26 | 0.08-0.16 |
| fourth sub-internally bending region 104 | 4-6 | 2.33-3.49 | 0.17-0.25 | 0.07-0.14 | 1.34-2.01 | 0.08-0.16 |
| fifth sub-internally bending region 105 | 4-6 | 2.08-3.13 | 0.17-0.25 | 0.17-0.25 | 1.58-2.38 | 0.19-0.37 |
| transition region 1213 | 4-6 | 1.58-2.38 | 0.17-0.25 | 0.17-0.25 | 2.08-3.13 | 0.19-0.37 |
| first sub-externally bending region 106 | 4-6 | 1.63-2.44 | 0.17-0.25 | 0.17-0.25 | 2.04-3.06 | 0.19-0.37 |

Within the aforesaid range of the dimensional design, the inventor has learned from simulation experiments that the risk of peeling of the adhesive layers can be greatly reduced. The bending region of the width W of 29 mm is taken as an example to perform a control experiment.

The first lengths L1 of the openings 14 of the semi-bending regions 121 of one embodiment of the present invention are gradually decreased from the internally bending region 1211 to the transition region 1213 and are gradually increased from the transition region 1213 to the first sub-externally bending region 106. A bending radius of curvature of the semi-bending regions 121 is gradually increased from the internally bending region 1211 to the transition region 1213 and is gradually decreased from the transition region 1213 to the first sub-externally bending region 106.

Furthermore, in the direction from the semi-bending regions 121 toward the non-bending regions 11, the first lengths L1 of the plurality of sub-internally bending regions of the internally bending region 1211 are gradually decreased, and the bending radius of curvature of the plurality of sub-internally bending region is gradually decreased. A bending radius of curvature of the first sub-externally bending region 106 is less than a bending radius of curvature of the second sub-externally bending region 107, and the bending radius of curvature of the second sub-externally bending region is greater than the bending radius of curvature of the transition region. By the aforesaid opening design, when the supporting plate is applied in the foldable display screen, the risk of easy peeling of the adhesive layers in the bending region is allowed to be reduced, while the overall bending radius of the bending region is allowed to be optimized.

Figure 7:
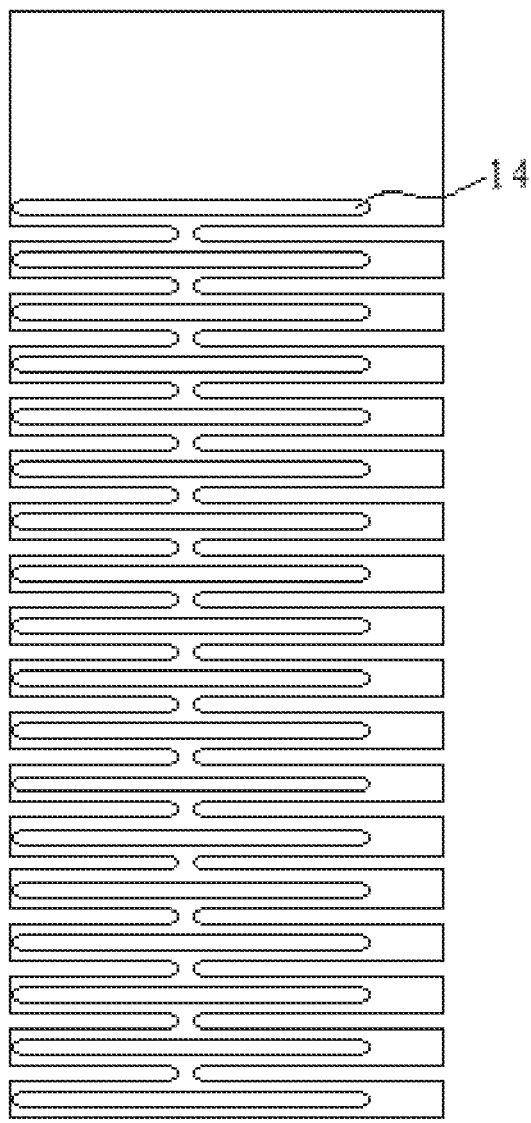
FIG. 7 is a structural schematic diagram of a supporting plate in prior art.
Figure 8:
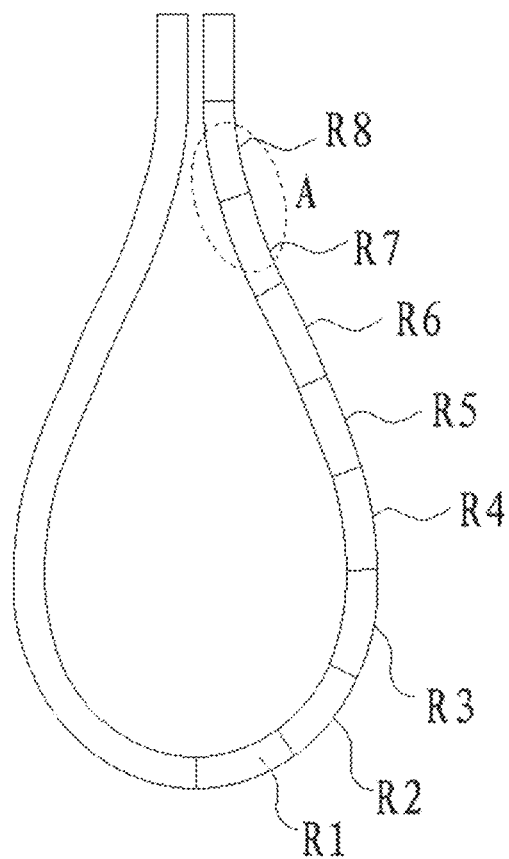
FIG. 8 is a structural schematic diagram after the supporting plate in the prior art is bent.

A control example is illustrated in FIG. 7 and FIG. 8. FIG. 7 is an opening design of a single size, and FIG. 8 is a pattern of after the supporting plate of FIG. 7 is bent. Wherein, each characteristic dimension of the openings 14 of each row are maintained to be consistent, i.e., the first length L1, the second length L2, the first interval S, and the second interval D of the openings 14 of each row are maintained to be consistent. Specifically, L2=4.3 mm, L1'=2.8 mm, S=0.2 mm, D=0.1 mm, a=0.2 mm, and b=0.1 mm. In this design, a position of a maximum cohesive force of an adhesive layer is at a location A in FIG. 8, and the risk of generation of peeling is greatest. Under the design of the supporting plate of this opening size, the optimal bending radii of the eight sub-bending regions are: R1=3.4 mm, R2=3.8 mm, R3=4.8 mm, R4=7.0 mm, R5=13.2 mm, R6=143.4 mm, R7=14.6 mm, and R8=7.0 mm.

For a first embodiment of the present invention, please refer to FIG. 4 and FIG. 9. In the opening design illustrated in FIG. 9, the second lengths L2 of each row are same, and the second intervals D of each can be same. The first lengths L1 of the internally bending region 1211 are greater than the first lengths L1 of the transition region 1213 and are greater than the first lengths L1 of the externally bending region 1212, and the first lengths L1 of the transition region 1213 are less than the first lengths L1 of the externally bending region 1212; or the first intervals S of the internally bending region 1211 are less than the first intervals S of the transition region 1213 and are less than the first intervals S of the externally bending region 1212, and the first intervals S of the transition region 1213 are greater than the first intervals S of the externally bending region 1212.

Specifically, widths of the first sub-internally bending region 101 to the fifth sub-internally bending region 105, the transition region 1213, the first sub-externally bending region 106 are 1.9 mm, and the width of the second sub-externally bending region 107 is 1.2 mm. Wherein, in the first sub-internally bending region 101, L1'=4.24 mm, S=0.16 mm, D=0.1 mm, a=0.2 mm, and b=0.1 mm; in the second sub-internally bending region 102, L1'=3.65 mm, S=0.75 mm, D=0.1 mm, a=0.2 mm, and b=0.1 mm; in the third sub-internally bending region 103, L1'=3.4 mm, S=1.0 mm, D=0.1 mm, a=0.2 mm, and b=0.1 mm; in the fourth sub-internally bending region 104, L1'=2.8 mm, S=1.6 mm, D=0.1 mm, a=0.2 mm, and b=0.1 mm; in the fifth sub-internally bending region 105, L1'=2.5 mm, S=1.9 mm, D=0.1 mm, a=0.2 mm, and b=0.1 mm; in the transition region 1213, L1'=1.9 mm, S=2.5 mm, D=0.1 mm, a=0.2 mm, and b=0.1 mm; and in the first sub-externally bending region 106, L1=1.95 mm, S=2.45 mm, D=0.1 mm, a=0.2 mm, and b=0.1 mm. In the aforesaid opening design, a position of a maximum cohesive force of an adhesive layer is at a location B in FIG. 4. In the aforesaid design, the optimal bending radii of the first sub-internally bending region 101 to the fifth sub-internally bending region 105, the transition region 1213, the first sub-externally bending region 106 are: R1'=2.7 mm, R2'=3.3 mm, R3'=5.2 mm, R4'=14.4 mm, R5'=19.4 mm, R6'=21.8 mm, R7'=11.9 mm, and R8'=119.2 mm.

Figure 14:
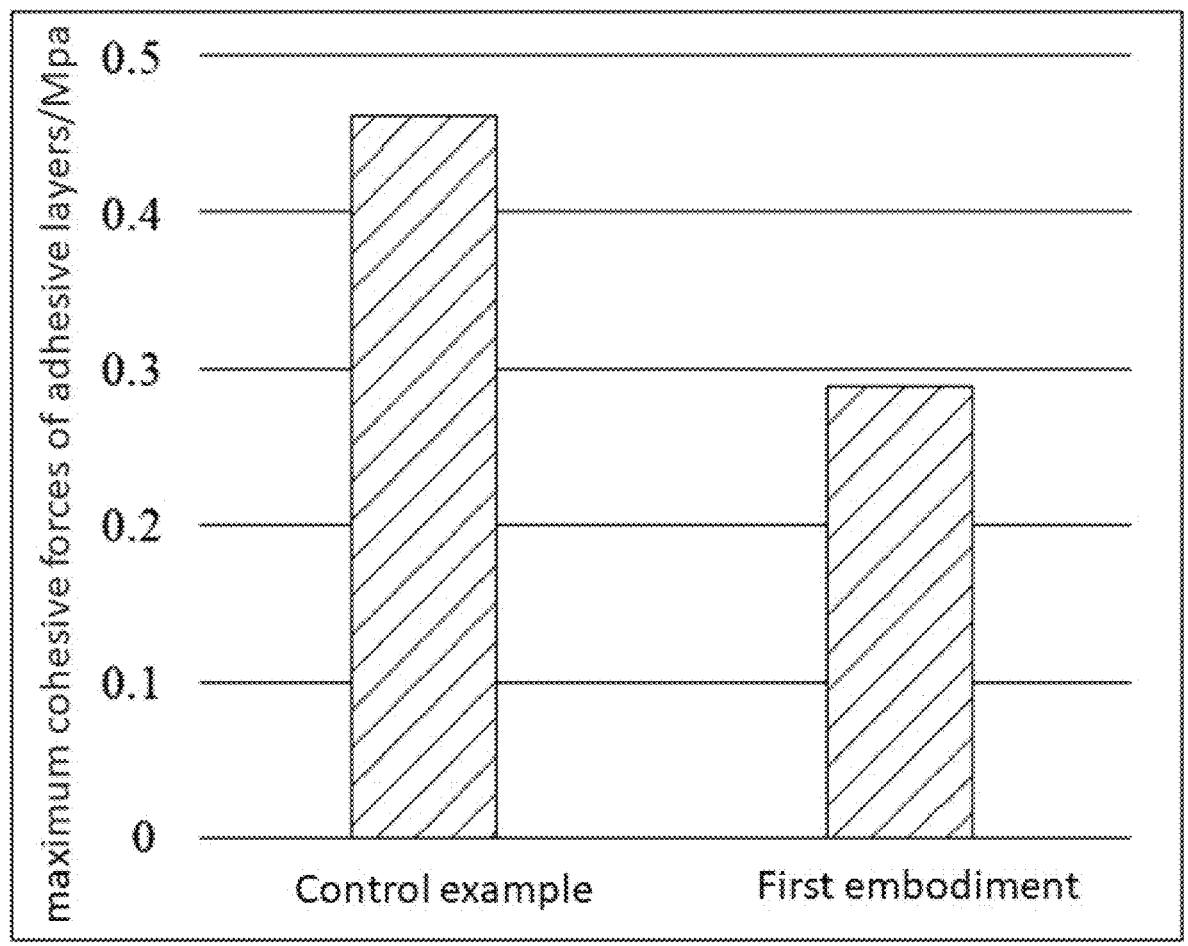
FIG. 14 is a bar chart of a maximum cohesive forces of adhesive layers of the first embodiment of the present invention and the prior art.

Please refer to FIG. 14. FIG. 14 is a bar chart of maximum cohesive forces of adhesive layers of the control example and the first embodiment. Compared to an opening design of a single size, the design of the opening size in this embodiment can reduce the maximum cohesive force of the adhesive layer by 37%, which greatly reduces the risk of peeling of the adhesive layer. Furthermore, adopting the design of the opening pattern of this embodiment can also adjust the bending radius of different bending regions, which can reduce a space occupied by the entire bending regions after being bent and improve the design space of the overall machine.

Figure 10:
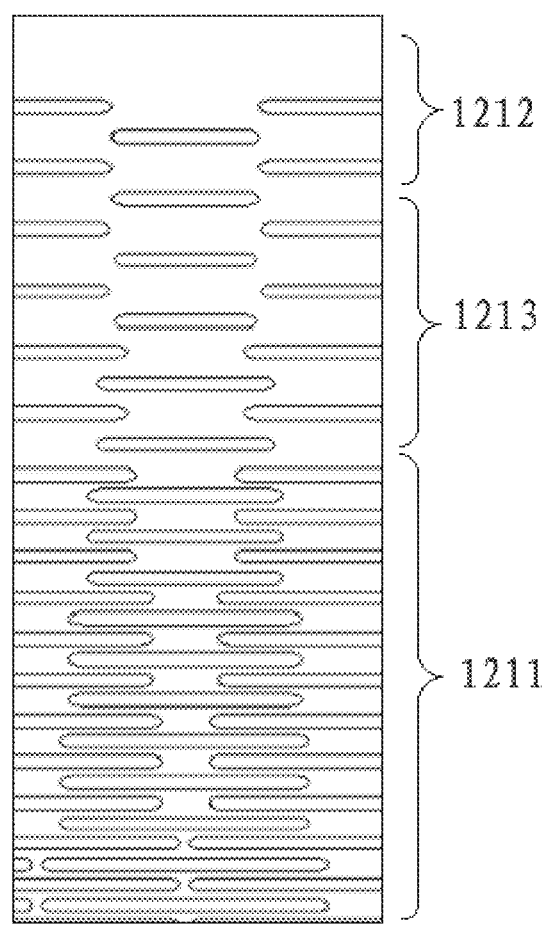
FIG. 10 is a structural schematic diagram of a supporting plate provided by a second embodiment of the present invention.

Please refer to FIG. 10 and FIG. 9. A difference between a second embodiment and the first embodiment is that the second intervals D is maintained to be unchanged in the first embodiment. In the second embodiment, along the direction from the semi-bending regions toward the non-bending region, the second intervals D are gradually increased to increase longitudinal intervals of the openings, which prevents intervals of the top portions of the openings from being too small (as location C illustrated in FIG. 9, which causes stress at this location to be large and concentrated).

Because the maximum cohesive force of the entire bending region is located at the border between the internally bending region and the externally bending region, the second intervals D can be gradually increased from one of the sub-internally bending regions of the internally bending region close to the transition region. Specifically, the second intervals D of the first sub-internally bending region 101 to the fourth sub-internally bending region 104 are same, and the second intervals D of the fifth sub-internally bending region 105, the transition region 1213, and the first sub-externally bending region 106 are same and are greater than the second intervals D of the first sub-internally bending region 101 to the fourth sub-internally bending region 104.

Specifically, in the second embodiment of the present invention, widths of the first sub-internally bending region 101 to the fifth sub-internally bending region 105, the transition region 1213, the first sub-externally bending region 106 are 1.9 mm, and the width of the second sub-externally bending region 107 is 1.2 mm. Wherein, in the first sub-internally bending region 101, L1'=4.24 mm, S=0.16 mm, D=0.1 mm, a=0.2 mm, and b=0.1 mm; in the second sub-internally bending region 102, L1'=3.65 mm, S=0.75 mm, D=0.1 mm, a=0.2 mm, and b=0.1 mm; in the third sub-internally bending region 103, L1'=3.4 mm, S=1.0 mm, D=0.1 mm, a=0.2 mm, and b=0.1 mm; in the fourth sub-internally bending region 104, L1'=2.8 mm, S=1.6 mm, D=0.1 mm, a=0.2 mm, and b=0.1 mm; in the fifth sub-internally bending region 105, L1'=2.5 mm, S=1.9 mm, D=0.25 mm, a=0.2 mm, and b=0.1 mm; in the transition region 1213, L1'=1.9 mm, S=2.5 mm, D=0.25 mm, a=0.2 mm, and b=0.1 mm; and in the first sub-externally bending region 106, L1=1.95 mm, S=2.45 mm, D=0.25 mm, a=0.2 mm, and b=0.1 mm.

Figure 11:
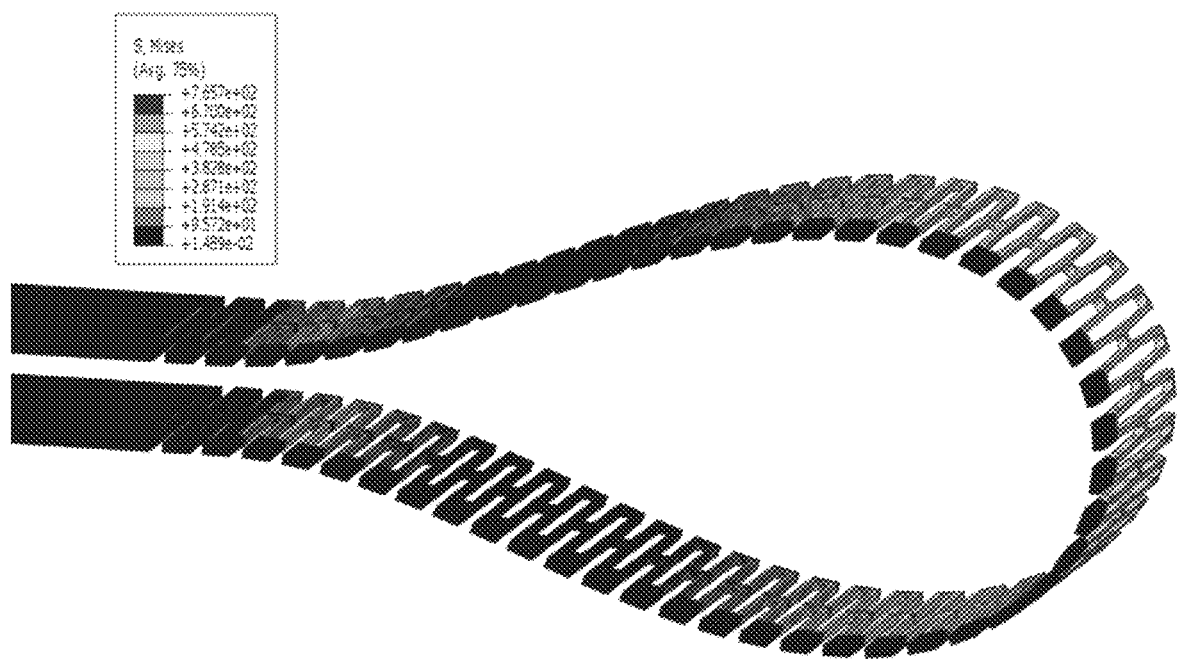
FIG. 11 is a stress cloud diagram after the supporting plate in the prior art in FIG. 7 is bent.
Figure 12:
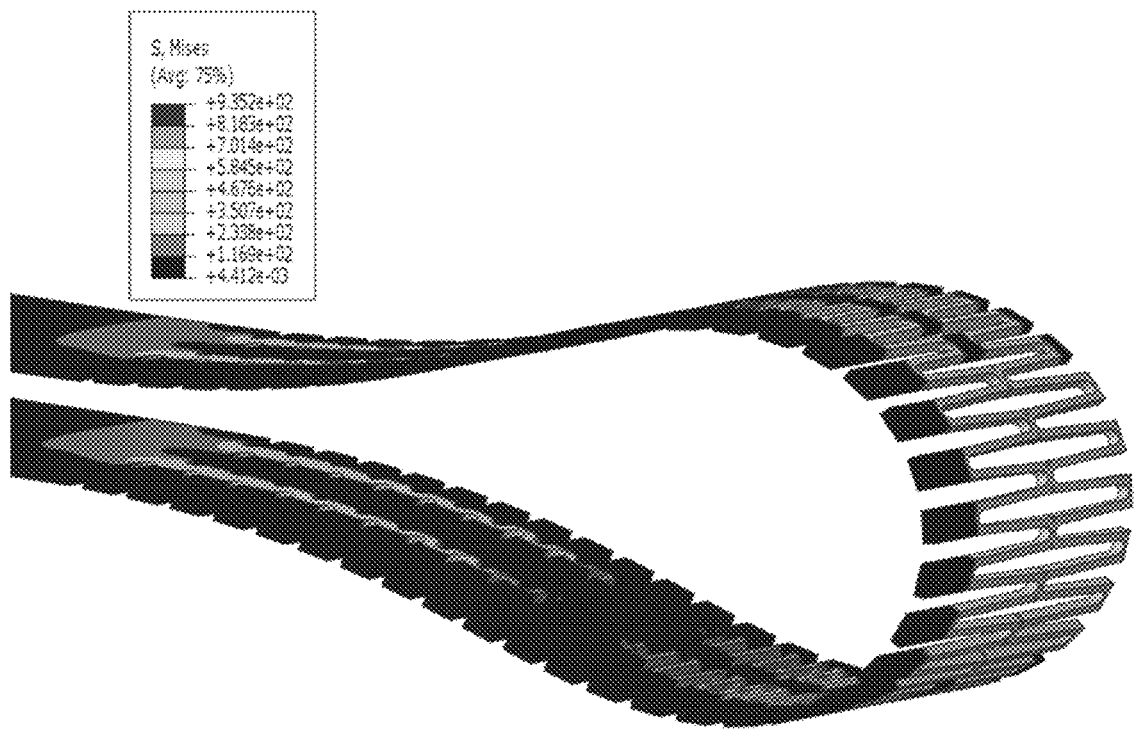
FIG. 12 is a stress cloud diagram after the supporting plate provided by the embodiment of FIG. 9 is bent.
Figure 13:
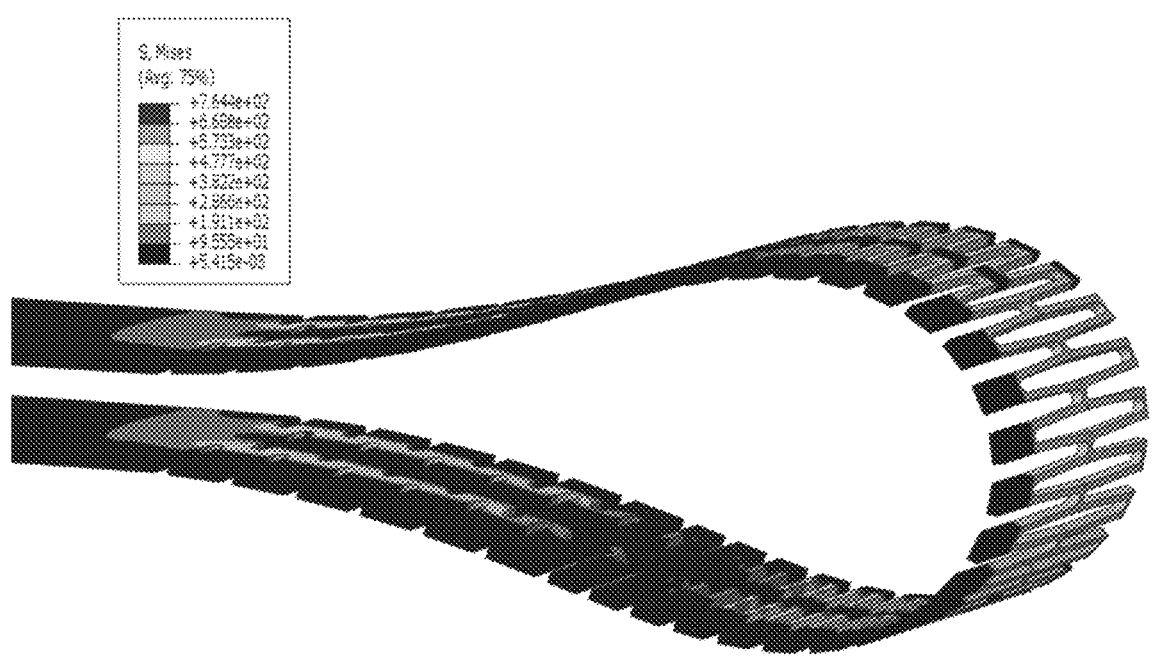
FIG. 13 is a stress cloud diagram after the supporting plate provided by the embodiment of FIG. 10 is bent.

Please refer to FIGS. 11 to 13. FIG. 11 is a cloud diagram corresponding to the control example. FIG. 12 is a cloud diagram corresponding to the first embodiment. FIG. 13 is a cloud diagram corresponding to the second embodiment. By stress cloud diagram simulations of the control example and the aforesaid first embodiment and second embodiment, a maximum stress of 7.656e+02 in the control example, a maximum stress of 9.352e+02 in the first embodiment, and a maximum stress of 7.644e+02 in the second embodiment are obtained. By comparison, on the basis of the first embodiment, the second intervals D are further gradually increased along the direction from the semi-bending regions 121 toward the non-bending region 11 in the second embodiment, which not only can reduce the risk of cohesion and then peeling of the adhesive layer, but also can reduce the stress of the supporting plate after being bent.

A material of the supporting plate in one embodiment of the present invention includes any one of stainless steel (steel use stainless, SUS), a copper alloy, or other alloy materials.

Please refer to FIG. 3, the supporting plate 10 of one embodiment of the present invention further includes a plurality of fractures 15 spaced apart. The fractures 15 are formed by borders of the openings 14 and free edges of the bending regions to improve extension performance of the supporting plate 10. The free edges are edges of the bending regions perpendicular to the bending axis.

The bending region 12 includes a central line. The central line is perpendicular to the bending axis 13. The bending region 12 is symmetrical about the central line, which allows a design of the openings and fractures in the bending region 12 to be symmetrically arranged, so that the stress on the supporting plate is allowed to be dispersed evenly during bending.

Figure 15:
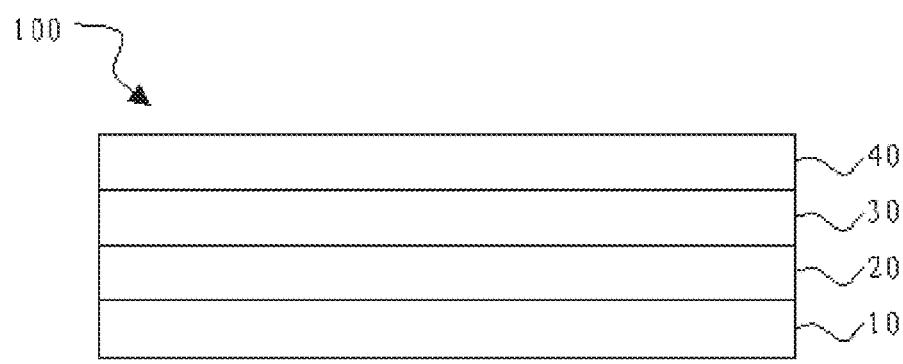
FIG. 15 is a structural schematic diagram of a foldable display device provided by one embodiment of the present invention.

Please refer to FIG. 15. One embodiment of the present invention further provides a foldable display device 100. The foldable display device 100 includes the supporting plate of any aforesaid embodiment and a flexible display panel 30 disposed on a side of the supporting plate 10. The foldable display device 100 is bent along the bending axis 13. Specifically. the foldable display device 100 is bent inward, and two sub-display surfaces of the flexible display panel 30 after being bent are opposite to each other.

The foldable display device 100 further includes a backplate 20 and a polarizer sheet 40. The backplate 20 is disposed on a side of the flexible display panel 30 close to the supporting plate 10. The polarizer sheet is disposed on a side of the flexible display panel 30 away from the supporting plate 10.

The flexible display panel 30 includes at least one bending part and non-bending parts located on two sides of the bending part. The bending part is bendable and is water drop-shaped.

Wherein, the bending part corresponds to the bending region 12 of the supporting plate 10, the bending part 10 includes two semi-bending parts symmetrically bent along the same bending axis as the supporting plate, and any of the semi-bending parts includes an internally bending portion corresponding to the internally bending region 1211 of the supporting plate 10 and an externally bending portion corresponding to the externally bending region 1212 of the supporting plate 10.

When the supporting plate 10 further includes the transition region 1213, the semi-bending parts of the flexible display panel 30 further include a transition part corresponding to the transition region 1213.

In processes of folding or unfolding of the foldable display device 100 of one embodiment of the present invention, bending shapes of the bending part of the flexible display panel 30 and the bending region 12 of the supporting plate 10 are maintained to be same.

The flexible display panel 30 can be a flexible organic light emitting diode (OLED) display panel, but it is not limited thereto, it can also be other flexible display panels having bending ability.

Because the backplate 20, the flexible display panel 30, the supporting plate 10, the polarizer sheet 40, and many components in the foldable display device 100 need to be bonded by adhesive layers, the foldable display device 100 further includes a plurality of adhesive layers. When the foldable display device 100 is bent, the maximum cohesive force of the adhesive layers is at the border between the internally bending region and the externally bending region, and the risk of peeling of the adhesive layers is greatest at this location, while the supporting plate 10 provided by the embodiments of the present invention can reduce the risk of peeling of the adhesive layers.

By designing the distribution density of the openings in the internally bending region 1211 to be greater than the distribution density of the openings 1212 in the externally bending region in the supporting plate 10, the risk of peeling of the adhesive layers at the border between the internally bending region 1211 and externally bending region 1212 is allowed to be reduced when the foldable display device 100 is bent. In addition, by designing the transition region 1213 of the smallest distribution density of the openings between the internally bending region 1211 and the externally bending region 1212, this allows the supporting plate 10 to be conducive to adapting to transition from inward bending to outward bending, and the risk of adhesive layers peeling is further reduced.

It can be understood that for those of ordinary skill in the art, various other corresponding changes and modifications can be made according to the technical solutions and technical ideas of the present invention, and all such changes and modifications are intended to fall within the scope of protection of the claims of the present invention.

What is claimed is:

1. A supporting plate configured to support a flexible display panel, wherein the supporting plate has at least one bending region and non-bending regions located on two sides of the bending region, the bending region comprises two semi-bending regions bent symmetrically along a bending axis, wherein any of the semi-bending regions comprises:
    an internal bending region located on an end away from the non-bending regions; and
    an outer bending region located on an end close to the non-bending regions and having a bending direction opposite to the internal bending region;
    wherein the semi-bending regions comprise a plurality of openings spaced apart, a distribution density of the openings in the internal bending region is a first distribution density, and a distribution density of the openings in the outer bending region is a second distribution density;
    wherein the first distribution density is greater than the second distribution density; and
    wherein the outer bending region comprises a first sub-externally bending region away from the non-bending regions and a second sub-externally bending region close to the non-bending regions, and the openings on the outer bending region are all located in the first sub-externally bending region, the first lengths of the openings of the semi-bending regions are gradually decreased from the internal bending region to the transition region and are gradually increased from the transition region to the first sub-externally bending region, a bending radius of curvature of the semi-bending regions is gradually increased from the internal bending region to the transition region and is gradually decreased from the transition region to the first sub-externally bending region.

2. The supporting plate as claimed in claim 1, wherein in a direction from the semi-bending regions toward the non-bending regions, the first distribution density of the outer bending region is gradually decreased.

3. The supporting plate as claimed in claim 2, wherein the semi-bending regions further comprise a transition region disposed between the internal bending region and the outer bending region, a distribution density of the openings in the transition region is a third distribution density, and the third distribution density is less than the second distribution density.

4. The supporting plate as claimed in claim 3, wherein the plurality of openings are distributed in a plurality of rows, and the plurality of openings in two adjacent rows are arranged in a staggered manner.

5. The supporting plate as claimed in claim 4, wherein intervals between two adjacent openings in one same row are first intervals, lengths of the openings in a row direction are first lengths, and the openings satisfy at least one of following conditions:
    the first lengths of the internal bending region are greater than the first lengths of the transition region and are greater than the first lengths of the outer bending region, and the first lengths of the transition region are less than the first lengths of the outer bending region; or
    the first intervals of the internal bending region are less than the first intervals of the transition region and are less than the first intervals of the outer bending region, and the first intervals of the transition region are greater than the first intervals of the outer bending region.

6. The supporting plate as claimed in claim 5, wherein intervals between the plurality of openings in the two adjacent rows are second intervals, and wherein the second intervals between each row of the semi-bending regions are same.

7. The supporting plate as claimed in claim 5, wherein widths of overlapping regions between the openings in the two adjacent rows are first overlapping widths, and in the direction from the semi-bending regions toward the non-bending regions, the overlapping regions between the openings in the two adjacent rows are gradually reduced, until there are no overlapping regions between the openings in the two adjacent rows.

8. The supporting plate as claimed in claim 5, wherein intervals between the plurality of openings in the two adjacent rows are second intervals, and in the direction from the semi-bending regions toward the non-bending regions, the second intervals are gradually increased.

9. The supporting plate as claimed in claim 8, wherein a sum of the first lengths and the first intervals are second lengths, and wherein the second lengths of each row of the semi-bending regions are same.

10. The supporting plate as claimed in claim 9, wherein the internal bending region comprises a plurality of sub-internally bending regions, and in the direction from the semi-bending regions toward the non-bending regions, the first lengths of the plurality of sub-internally bending regions are gradually decreased.

11. The supporting plate as claimed in claim 10, wherein in the direction from the semi-bending regions toward the non-bending regions, the second intervals of the plurality of sub-internally bending regions are same, and the second intervals of the transition region are equal to the second intervals of the outer bending region.

12. The supporting plate as claimed in claim 1, wherein in the direction from the semi-bending regions toward the non-bending regions, the first lengths of the plurality of sub-internally bending regions of the internal bending region are gradually decreased, and a bending radius of curvature of the plurality of sub-internally bending regions is gradually decreased.

13. The supporting plate as claimed in claim 1, wherein a bending radius of curvature of the first sub-externally bending region is less than a bending radius of curvature of the second sub-externally bending region, and the bending radius of curvature of the second sub-externally bending region is greater than a bending radius of curvature of the transition region.

14. The supporting plate as claimed in claim 4, wherein lengths of the openings in a row direction are first lengths, in the plurality of openings arranged in one same column, the first lengths of the internal bending region are greater than the first lengths of the transition region and are greater than the first lengths of the outer bending region, and the first lengths of the transition region are less than the first lengths of the outer bending region.

15. The supporting plate as claimed in claim 1, wherein the bending region comprises a central line, the central line is perpendicular to the bending axis, and the bending region is symmetrical about the central line.

16. The supporting plate as claimed in claim 1, wherein the openings are strip-shaped openings extending along a direction of the bending axis.

17. The supporting plate as claimed in claim 1, wherein the bending region further comprises a plurality of fractures spaced apart, and the fractures are formed by borders between the openings and edges of the bending region perpendicular to the bending axis.

18. A foldable display device, comprising a supporting plate and a flexible display panel disposed on a side of the supporting plate, the supporting plate comprises at least one bending region and non-bending regions located on two sides of the bending region, the bending region comprises two semi-bending regions bent symmetrically along a bending axis, and any of the semi-bending regions comprises:
   an internal bending region located on an end away from the non-bending regions; and
   an outer bending region located on an end close to the non-bending regions and having a bending direction opposite to the internal bending region,
   wherein the semi-bending regions comprise a plurality of openings spaced apart, a distribution density of the openings in the internal bending region is a first distribution density, and a distribution density of the openings in the outer bending region is a second distribution density, and wherein the first distribution density is greater than the second distribution density, and
   wherein the outer bending region comprises a first sub-externally bending region away from the non-bending regions and a second sub-externally bending region close to the non-bending regions, and the openings on the outer bending region are all located in the first sub-externally bending region, the first lengths of the openings of the semi-bending regions are gradually decreased from the internal bending region to the transition region and are gradually increased from the transition region to the first sub-externally bending region, a bending radius of curvature of the semi-bending regions is gradually increased from the internal bending region to the transition region and is gradually decreased from the transition region to the first sub-externally bending region,
   the flexible display panel comprises at least one bending part and non-bending parts located on two sides of the bending part,
   wherein the bending part corresponds to the bending region of the supporting plate,
   the bending part comprises two semi-bending parts symmetrically bent along the same bending axis as the supporting plate, and
   any of the semi-bending parts comprises an internal bending portion corresponding to the internal bending region of the supporting plate and an outer bending portion corresponding to the outer bending region of the supporting plate.

19. The foldable display device as claimed in claim 18, wherein the foldable display device further comprises:
   a backplate disposed on a side of the flexible display panel close to the supporting plate; and
   a polarizer sheet disposed on a side of the flexible display panel away from the supporting plate.

* * * * *